United States Patent
Shimizu

(10) Patent No.: US 9,966,124 B2
(45) Date of Patent: May 8, 2018

(54) MEMORY DEVICE

(71) Applicant: TOSHIBA MEMORY CORPORATION, Minato-ku, Tokyo (JP)

(72) Inventor: Naoki Shimizu, Kawasaki Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days. days.

(21) Appl. No.: 15/459,731

(22) Filed: Mar. 15, 2017

(65) Prior Publication Data

US 2018/0068704 A1 Mar. 8, 2018

Related U.S. Application Data

(60) Provisional application No. 62/383,361, filed on Sep. 2, 2016.

(51) Int. Cl.
| | | |
|---|---|---|
| *G11C 11/00* | (2006.01) | |
| *G11C 11/16* | (2006.01) | |
| *G11C 11/15* | (2006.01) | |

(52) U.S. Cl.
CPC .......... *G11C 11/1675* (2013.01); *G11C 11/15* (2013.01); *G11C 11/16* (2013.01); *G11C 11/1673* (2013.01)

(58) Field of Classification Search
CPC . G11C 11/1675; G11C 11/1673; G11C 11/15; G11C 11/16
See application file for complete search history.

(56) References Cited

U.S. PATENT DOCUMENTS

| | | | | |
|---|---|---|---|---|
| 6,118,703 A | * | 9/2000 | Hamaguchi | ........ G11C 16/3454 365/185.22 |
| 7,010,575 B1 | | 3/2006 | MacArthur et al. | |
| 7,035,144 B2 | * | 4/2006 | Kim | .................... G11C 11/5628 365/185.03 |
| 9,036,429 B2 | * | 5/2015 | Hah | ......................... G11C 7/00 365/185.18 |
| 9,076,546 B2 | * | 7/2015 | Nakayama | ............. G11C 16/26 |
| 2014/0032860 A1 | | 1/2014 | Yamada et al. | |

FOREIGN PATENT DOCUMENTS

| | | |
|---|---|---|
| JP | 2001109708 A | 4/2001 |
| JP | 5693712 B2 | 4/2015 |

* cited by examiner

*Primary Examiner* — Pho M Luu
(74) *Attorney, Agent, or Firm* — Holtz, Holtz & Volek PC

(57) ABSTRACT

A memory device includes: a memory cell; a data buffer which receives write data; a first latch circuit which latches data stored in the memory cell; a second latch circuit which latches data transferred from the data buffer; a controller which performs a first transfer operation to transfer data from the data buffer to the second latch circuit after a write command is received and then a first period elapses; and a write circuit which performs a write operation to write data of the second latch circuit to the memory cell after the first transfer operation, when data of the first latch circuit is different from the data of the second latch circuit. The controller performs a second transfer operation to transfer data from the second latch circuit to the first latch circuit after the write operation.

15 Claims, 14 Drawing Sheets

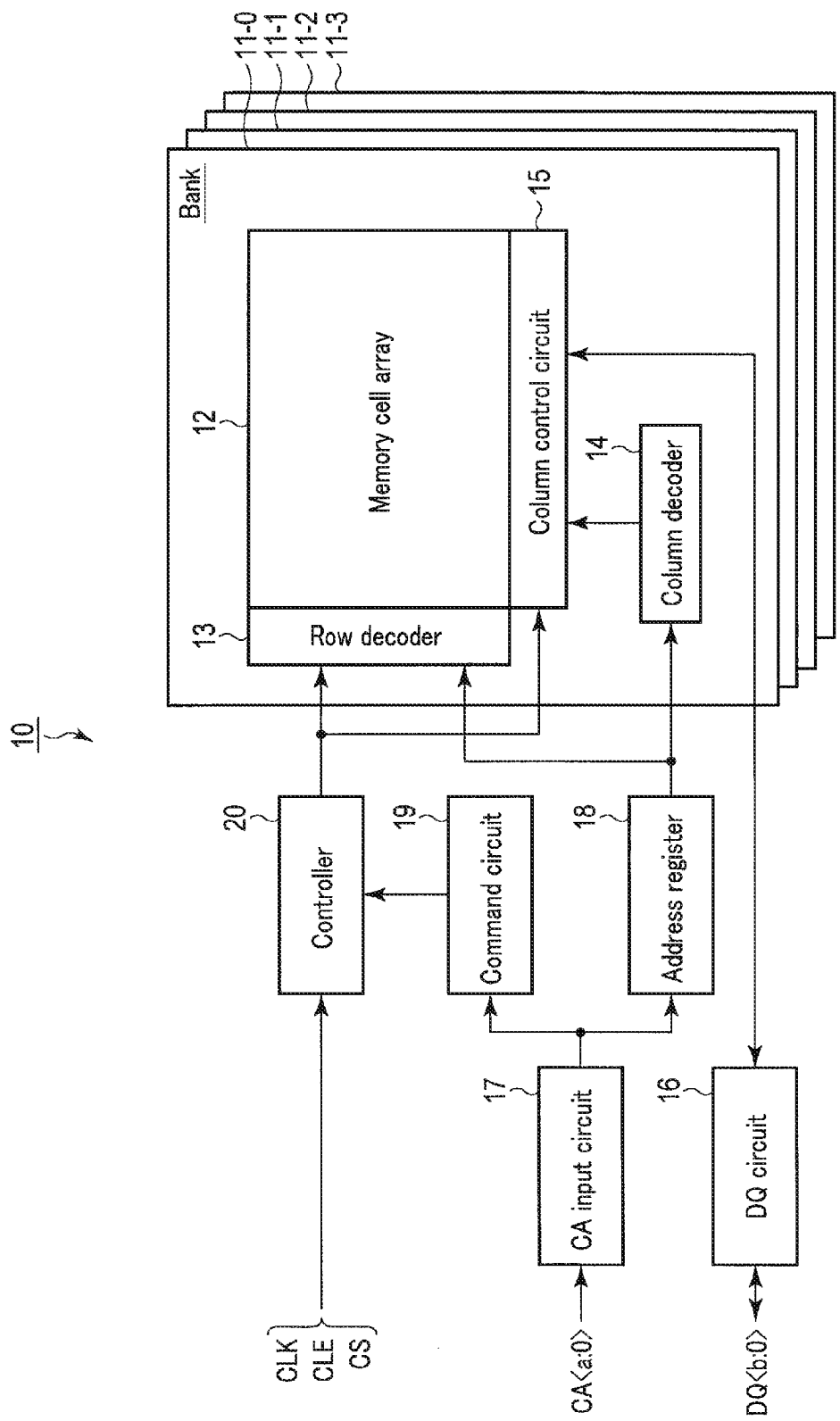
F I G. 1

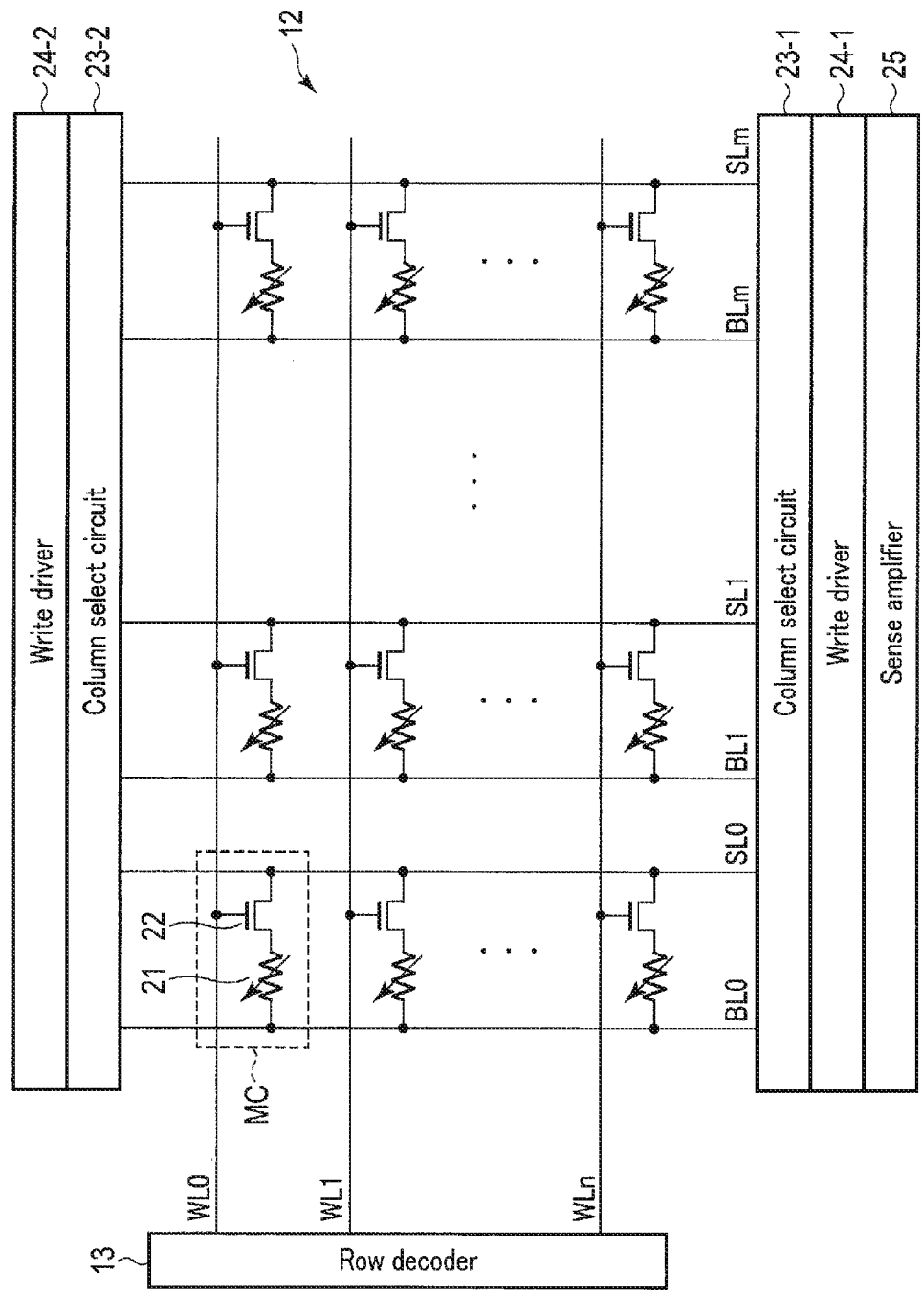
F I G. 2

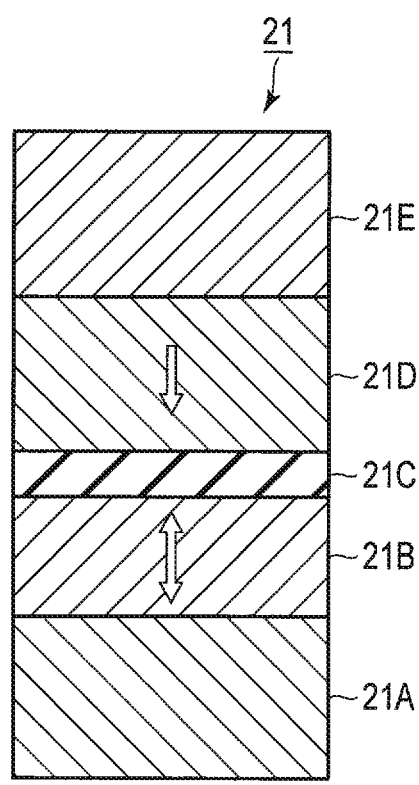
F I G. 3

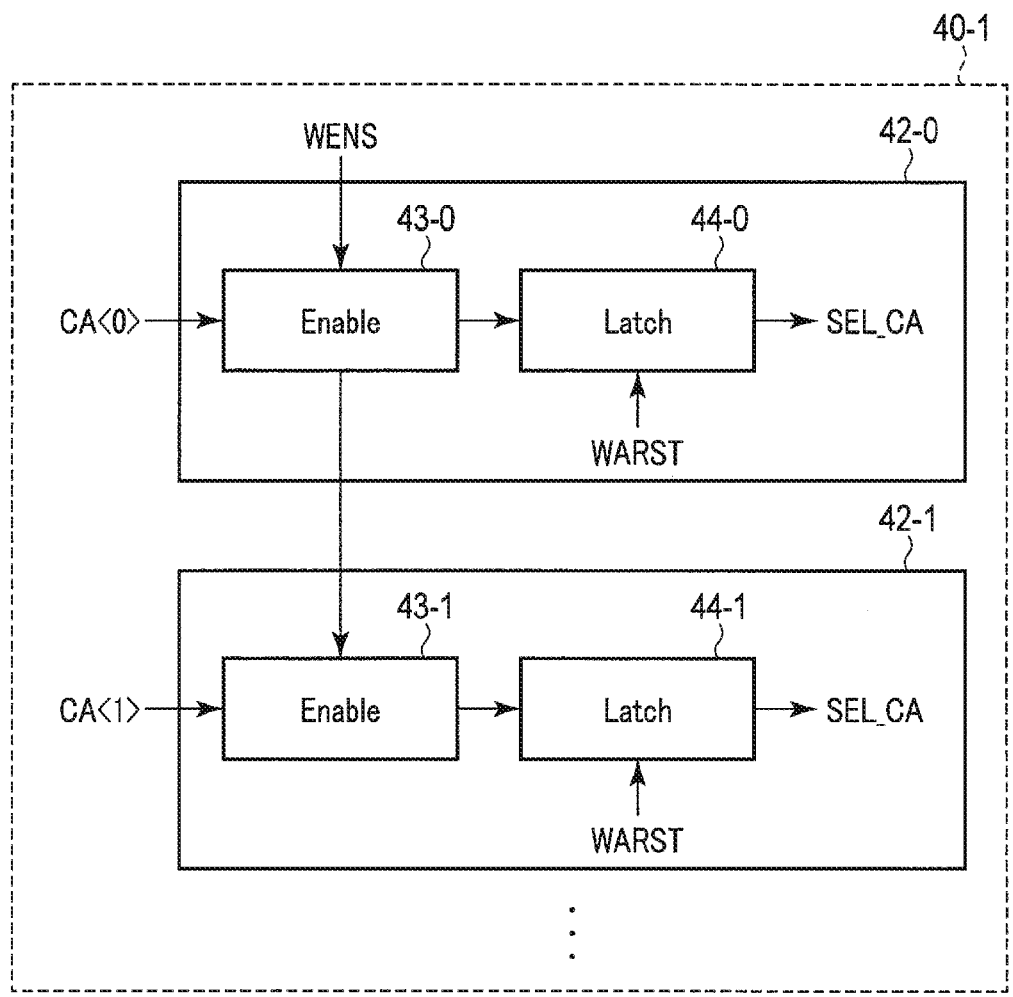
F I G. 7

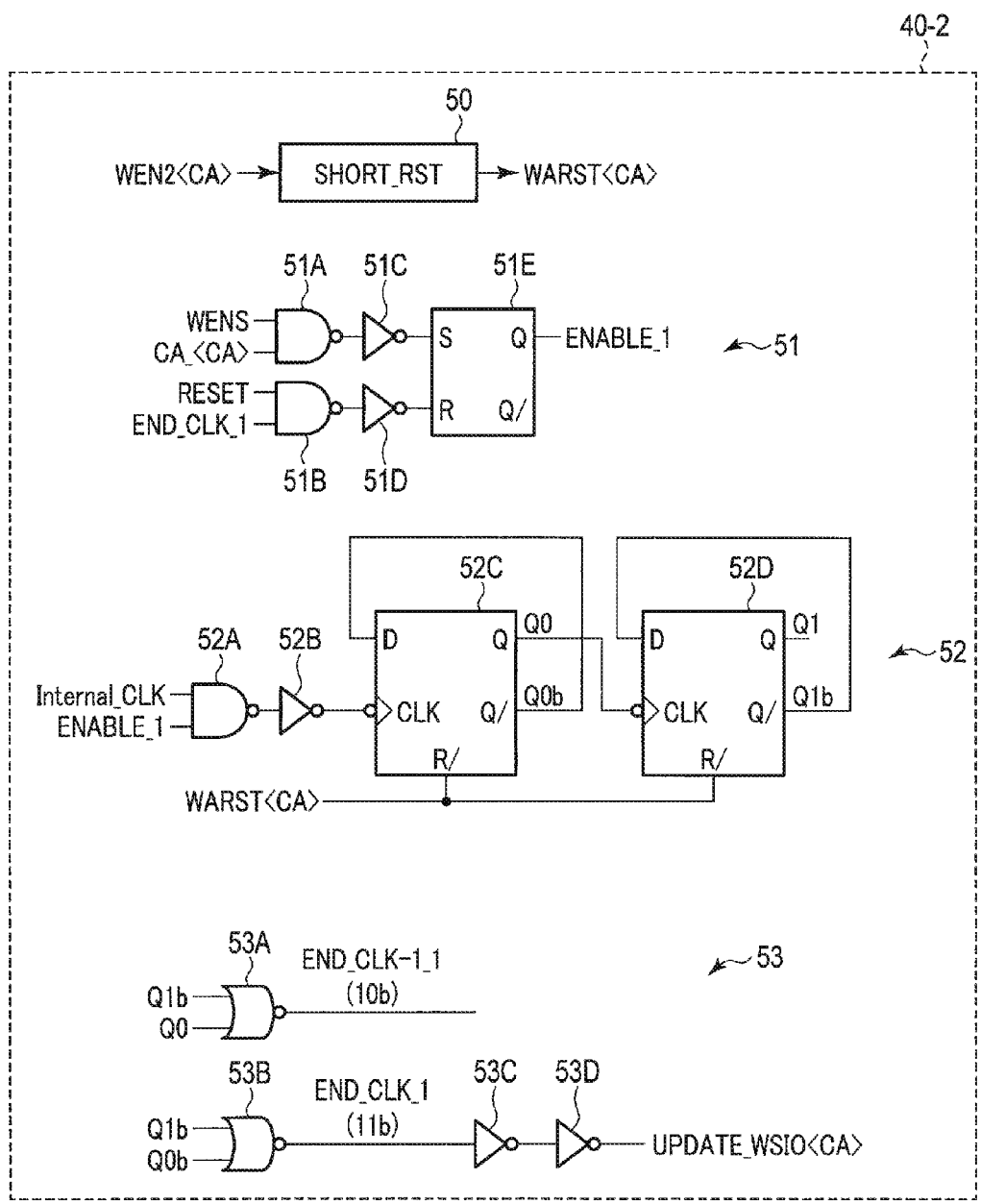
F I G. 8

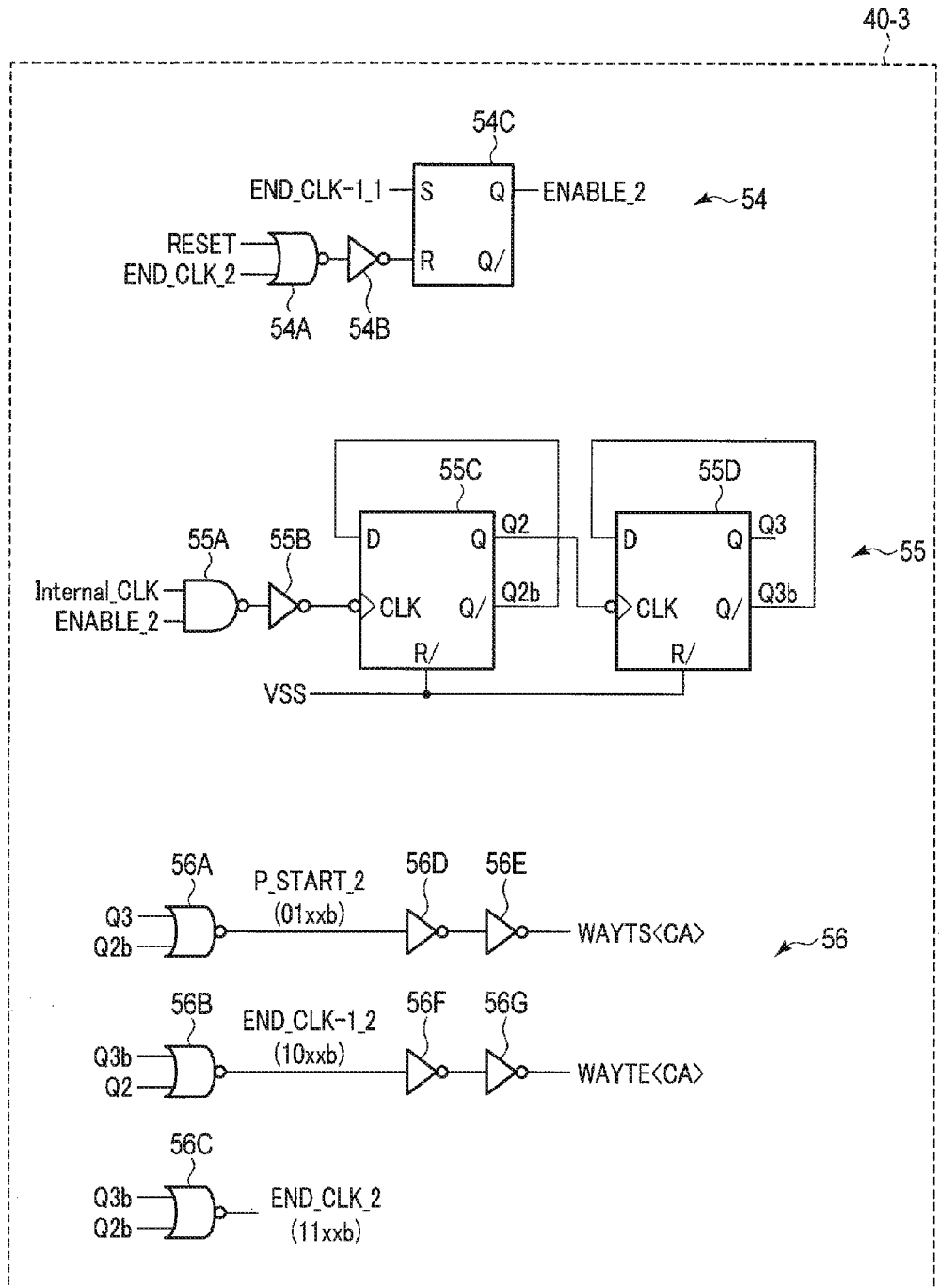
F I G. 9

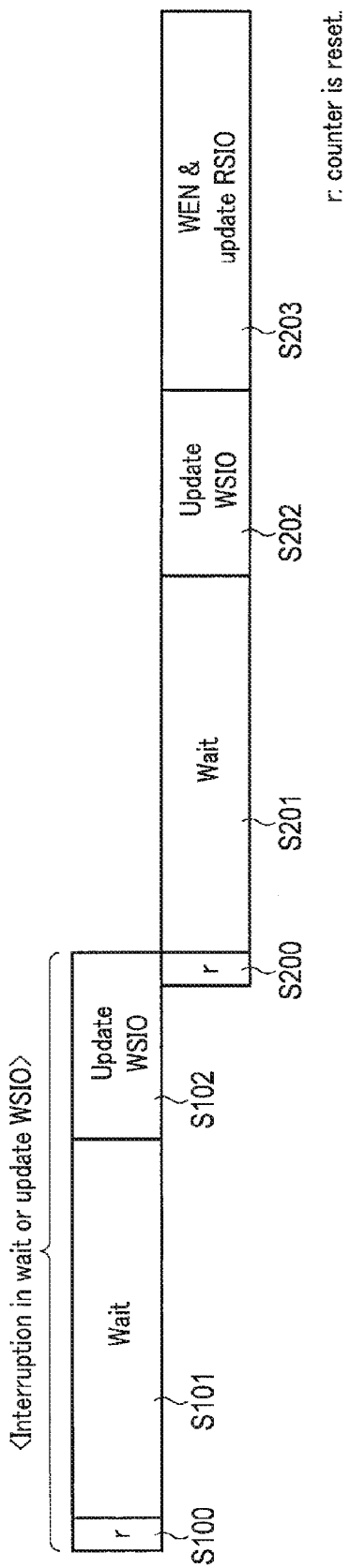
F I G. 12

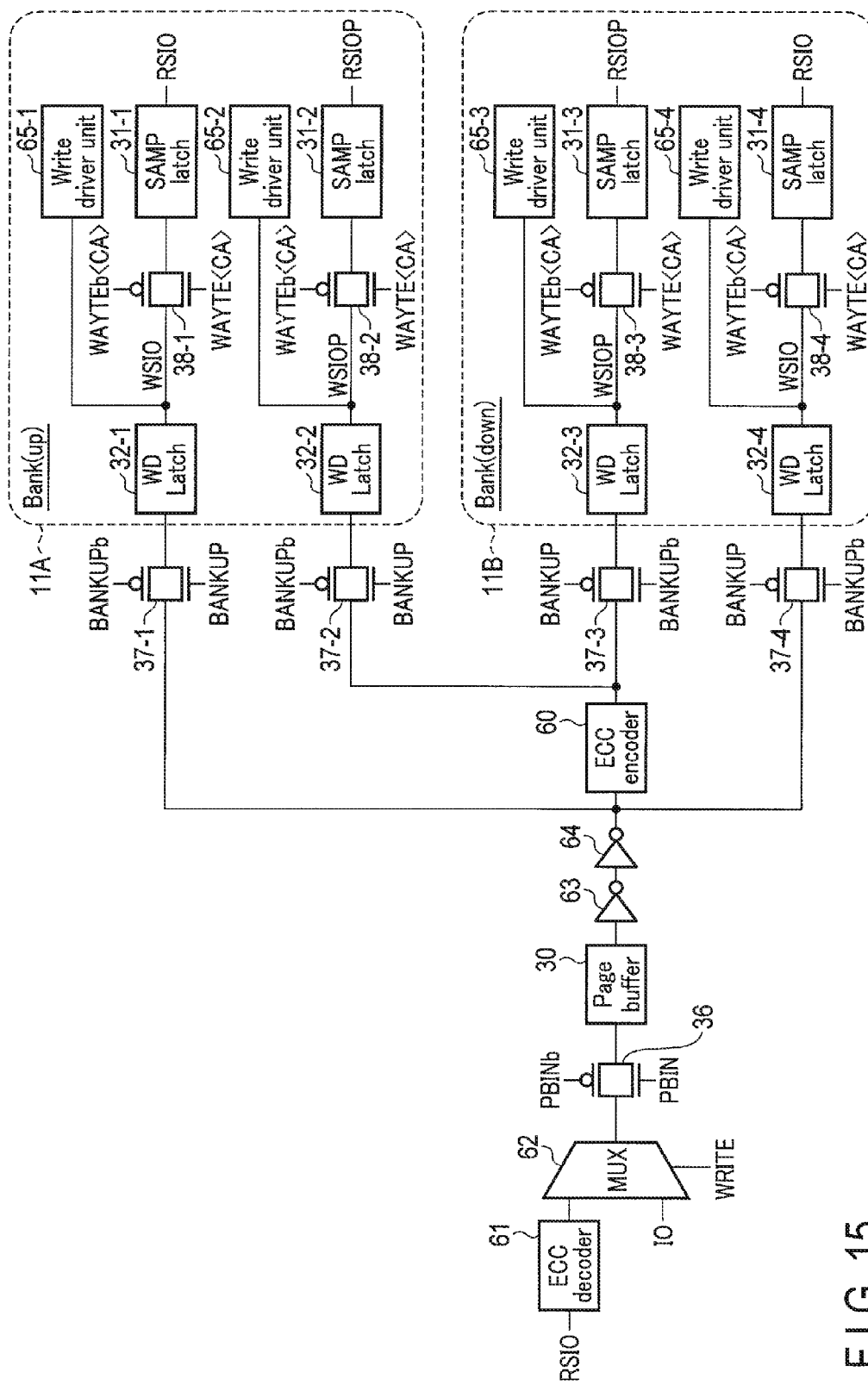
F I G. 15

MEMORY DEVICE

CROSS-REFERENCE TO RELATED APPLICATIONS

This application claims the benefit of U.S. Provisional Application No. 62/383,361, filed Sep. 2, 2016, the entire contents of which are incorporated herein by reference.

FIELD

Embodiments of the present invention relate generally to a memory device.

BACKGROUND

Resistance change memories are known as a type of semiconductor memory device. Magnetoresistive random access memories (MRAM) are known as a type of resistance change memory. MRAMs are memory devices using magnetoresistive elements having a magnetoresistive effect as memory cells storing information. Writing methods of MRAMs include a spin-transfer torque writing method. The spin-transfer torque writing method has a property that a spin-transfer torque current necessary for magnetization switching reduces as the size of the magnetic substance reduces, and has an advantage in high integration, reduction in power consumption, and improvement in performance.

BRIEF DESCRIPTION OF THE DRAWINGS

FIG. 1 is a block diagram of a semiconductor memory device according to an embodiment;

FIG. 2 is a circuit diagram of part of a memory cell array and a column control circuit illustrated in FIG. 1;

FIG. 3 is a cross-sectional view of an MTJ element illustrated in FIG. 2;

FIG. 7 is a block diagram of a first circuit included in the WEN control circuit;

FIG. 8 is a circuit diagram of a second circuit included in the WEN control circuit;

FIG. 9 is a circuit diagram of a third circuit included in the WEN control circuit;

FIG. 12 is a flowchart illustrating a write sequence according to a second example;

FIG. 15 is a block diagram of a column control circuit according to an embodiment;

DETAILED DESCRIPTION

Figure 4:
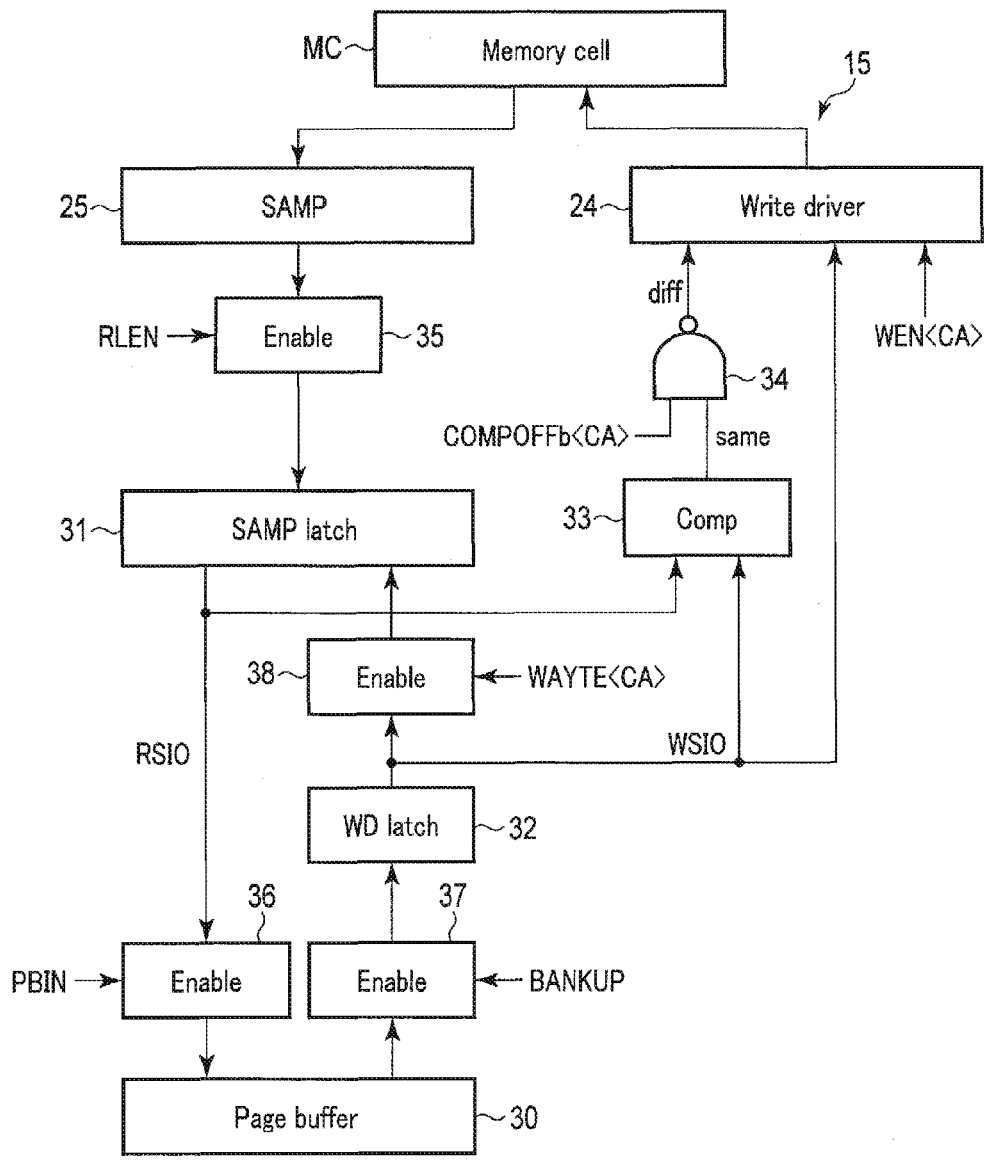
FIG. 4 is a block diagram of the column control circuit illustrated in FIG. 1.

In general, according to one embodiment, there is provided a memory device comprising:

a memory cell;
a data buffer receiving write data from an exterior;
a first latch circuit latching data stored in the memory cell;
a second latch circuit latching data transferred from the data buffer;
a controller performing a first transfer operation to transfer data from the data buffer to the second latch circuit after a write command is received and then a first period elapses; and
a write circuit performing a write operation to write data of the second latch circuit to the memory cell after the first transfer operation, when the data of the first latch circuit is different from the data of the second latch circuit,
wherein the controller performs a second transfer operation to transfer data from the second latch circuit to the first latch circuit after the write operation, and
the first period is equal to or longer than a second period ranging from start of the write operation to finish of the second transfer operation.

Embodiments will be explained hereinafter with reference to the drawings. In the following explanation, constituent elements having the same function and structure are denoted by the same reference numerals, and overlapping explanation thereof is performed only when necessary. The drawings are schematic or conceptual, and sizes and ratios of the drawings are not necessarily equal to the actual ones. Each of the embodiments illustrates a device and a method to materialize the technical idea of the embodiment, and the technical idea of the embodiment does not specify the material, the shape, the structure, and arrangement of constituent components to the following ones.

Embodiments described hereinafter illustrate a magnetoresistive random access memory (MRAM) serving as a type of a resistance change memory, as an example of the semiconductor memory device.

[1] Whole Configuration of Semiconductor Memory Device

FIG. 1 is a block diagram of a semiconductor memory device 10 according to an embodiment. The semiconductor memory device 10 includes a plurality of memory banks (also simply referred to as "bank") 11, an input/output circuit (DQ circuit) 16, a command and address (CA) input circuit 17, an address register 18, a command circuit 19, and a controller (main control circuit) 20.

Each bank 11 includes a memory cell array 12, a row decoder 13, a column decoder 14, and a column control circuit 15. FIG. 1 illustrates four memory banks 11-0 to 11-3. The number of memory banks is not limited, and may be one. In the explanation of the present embodiment, when it is unnecessary to specifically distinguish the memory banks 11-0 to 11-3 from each other, the branch numbers are omitted in the description, and explanation relating to the description without the branch numbers is common to each of the memory banks 11-0 to 11-3. Other reference numerals with branch numbers will be handled in the same manner.

The memory cell array 12 includes a plurality of memory cells MC that are two-dimensionally arranged in a matrix manner. The row decoder 13 selects one row (specifically, a word line described later) in the memory cell array 12, in accordance with the row address. The column decoder 14 selects one column (specifically, a pair of a bit line and a source line described later) in the memory cell array 12, in accordance with the column address.

The column control circuit 15 writes data and reads data to and from the selected column. As described later, the column control circuit 15 includes a column select circuit, a sense amplifier (read circuit), a write driver (write circuit), and a page buffer (data buffer). The column control circuit 15 may include an error checking and correcting (ECC) circuit.

The DQ circuit 16 is connected with an external device through a plurality of data lines (also referred to as data input/output lines) DQ<b:0>. The data lines DQ<b:0> serve as a bidirectional data bus. The data lines DQ<b:0> may also be referred to as data input/output pins. The DQ circuit 16 receives input data (write data) from an external device through the data lines DQ<b:0>, and transmits the write data to the memory bank 11. The DQ circuit 16 also receives output data (read data) from the memory bank 11, and outputs the read data to the external device through the data lines DQ<b:0>.

The CA input circuit 17 is connected with an external device through a plurality of command and address lines CA<a:0>. The command and address lines CA<a:0> serve as a uni-directional bus. The command and address lines CA<a:0> can also be referred to as command and address pins. The CA input circuit 17 receives a command and an address from the external device through the command and address lines CA<a:0>. The address received by the CA input circuit 17 includes a bank address (address to designate the memory bank), a row address, and a column address. A plurality of types of commands received by the CA input circuit 17 are instructions to designate the operation of the memory bank, and include a precharge command, an active command, a write command, a read command, and a reset command, and the like.

The address register 18 receives addresses from the CA input circuit 17. The address register 18 transmits a bank address and a row address to the row decoder 13, and transmits a column address to the column decoder 14.

The command circuit 19 receives a command from the CA input circuit 17. The command circuit 19 decodes the command, and transmits a decode result to the controller 20.

The controller 20 controls the whole operation of the semiconductor memory device 10. The controller 20 receives various control signals, such as a clock signal CLK, a clock enable signal CKE, and a chip select signal CS from an external device. The controller 20 controls a read operation and a write operation and the like, in accordance with an instruction from the command circuit 19.

[1-1] Configuration of Memory Cell Array 12

The following is explanation of the memory cell array 12. FIG. 2 is a circuit diagram of part of the memory cell array 12 and the column control circuit 15.

The memory cell array 12 is provided with a plurality of word lines WL (WL0 to WLn) extending in a row direction, a plurality of bit lines BL (BL0 to BLm) extending in a column direction crossing the row direction, and a plurality of source lines SL (SL0 to SLm) extending in the column direction. The bit lines BL and the source lines SL are alternately arranged. One memory cell MC is connected with one word line WL, one bit line BL, and one source line SL.

Each memory cell MC includes a magnetic tunnel junction (MTJ) element 21 serving as a memory element, and a cell transistor 22. The MTJ element 21 is a magnetoresistive element (magnetoresistive effect element) that stores data by change of a resistance state, and in which data is rewritable with, for example, a current. The cell transistor 22 is formed of, for example, an n-channel metal oxide semiconductor (MOS) transistor.

One terminal of the MTJ element 21 is connected with a bit line BL, and the other terminal thereof is connected with a drain of the cell transistor 22. A gate of the cell transistor 22 is connected with a word line WL, and a source thereof is connected with a source line SL.

The row decoder 13 is connected with a plurality of word lines WL. The row decoder 13 activates a word line corresponding to the selected row.

The column control circuit 15 includes column select circuits 23-1 and 23-2, write drivers 24-1 and 24-2, and a sense amplifier 25. The column select circuits 23-1 and 23-2 may also be referred to as column select circuit 23 together. In the same manner, the write drivers 24-1 and 24-2 may also be referred to as write driver 24 together.

The column select circuit 23 is connected with the bit lines BL and the source lines SL. The column select circuit 23 selects a column of the memory cell array 12, based on a column select signal from the column decoder 14.

The write driver 24 is connected with the bit lines BL and the source lines SL through the column select circuit 23. The write driver 24 writes data to the selected memory cell, by causing a current to flow through the selected memory cell. The write driver 24 is supplied with various voltages necessary for a write operation from a voltage generator (not illustrated).

The sense amplifier 25 is connected with the bit lines BL and the source lines SL through the column select circuit 23. The sense amplifier 25 senses a current flowing through the selected memory cell, to read data stored in the selected memory cell. The sense amplifier 25 is supplied with various voltages necessary for a read operation from the voltage generator (not illustrated).

The bit lines and the source lines may be hierarchized. For example, the memory cell array includes a plurality of memory blocks, and one sense amplifier is provided to correspond to bit lines and sources lines in one memory block. A plurality of sense amplifiers are provided to correspond to respective memory blocks. In one memory block, one bit line and one source line that are selected by the column select circuit are connected with one sense amplifier. The correspondence between the write driver and the bit lines and the source lines is the same as that of the sense amplifier.

[1-2] Structure of MTJ Element 21

The following is explanation of an example of the structure of the MTJ element 21. FIG. 3 is a cross-sectional view of the MTJ element 21.

The MTJ element 21 is formed by successively stacking a lower electrode 21A, a memory layer (free layer) 21B, a non-magnetic layer (tunnel barrier layer) 21C, a reference layer (fixed layer) 21D, and an upper electrode 21E. For example, the lower electrode 21A is electrically connected with the cell transistor 22, and the upper electrode 21E is electrically connected with the bit line BL. The stacking order of the memory layer 21B and the reference layer 21D may be reversed.

Each of the memory layer 21B and the reference layer 21D is formed of a ferromagnetic material. The tunnel barrier layer 21C is formed of, for example, an insulating material such as MgO.

Each of the memory layer 21B and the reference layer 21D has magnetic anisotropy in the perpendicular direction, and easy magnetization in the perpendicular direction. The magnetization direction in the perpendicular direction indicates that the magnetization direction is perpendicular or substantially perpendicular to the film surface (upper surface or lower surface). The term "substantially perpendicular" includes the state that the direction of the residual magnetization falls within the range of $45°<\theta≤90°$ with respect to the film surface. The magnetization direction of the memory layer 21B and the reference layer 21D may be an in-plane direction.

The memory layer 21B has a variable (inverted) magnetization direction. The expression "variable magnetization direction" means that the magnetization direction of the memory layer 21B changes when a predetermined write current is caused to flow through the MTJ element 21. The reference layer 21D has an invariable (fixed) magnetization direction. The expression "invariable magnetization direction" means that the magnetization direction of the reference layer 21D does not change when a predetermined write current is caused to flow through the MTJ element 21.

The reference layer 21D is set to have perpendicular magnetic anisotropic energy (or coercive force) sufficiently larger than that of the memory layer 21B. Setting of magnetic anisotropy is enabled by adjusting the material, area, and film thickness of the magnetic layer. In this manner, the magnetization switching current of the memory layer 21B is reduced, and the magnetization switching current of the reference layer 21D is set larger than that of the memory layer 21B. This structure enables achievement of the MTJ element 21 including the memory layer 21B with variable magnetization direction and the reference layer 21D with invariable magnetization direction with respect to a predetermined write current.

The present embodiment adopts a spin-transfer torque writing method in which a write current is caused to directly flow through the MTJ element 21, and the magnetization state of the MTJ element 21 is controlled with the write current. The MTJ element 21 can have either of a low-resistance state and a high-resistance state, according to whether the relative relation of magnetization between the memory layer 21B and the reference layer 21D is parallel or antiparallel. Specifically, the MTJ element 21 is a variable resistive element.

When a write current going from the memory layer 21B to the reference layer 21D is caused to flow through the MTJ element 21, the relative relation of magnetization between the memory layer 21B and the reference layer 21D becomes parallel. In the parallel state, the resistance value of the MTJ element 21 becomes lowest, and the MTJ element 21 is set to the low-resistance state. The low-resistance state of the MTJ element 21 is defined as, for example, data "0".

By contrast, when a write current going from the reference layer 21D to the memory layer 21B is caused to flow through the MTJ element 21, the relative relation of magnetization between the memory layer 21B and the reference layer 21D becomes antiparallel. In the antiparallel state, the resistance value of the MTJ element 21 becomes highest, and the MTJ element 21 is set to the high-resistance state. The high-resistance state of the MTJ element 21 is defined as, for example, data "1".

In this manner, the MTJ element 21 can be used as a memory element capable of storing 1-bit data (binary data). Assignment of the resistance state of the MTJ element 21 to data can be set as desired.

When data is read from the MTJ element 21, a read voltage is applied to the MTJ element 21, and the resistance value of the MTJ element 21 is sensed based on a read current flowing through the MTJ element 21 in the application. The read current is set to a value sufficiently smaller than a threshold at which magnetization switching occurs by spin-transfer torque.

[1-3] Structure of Column Control Circuit 15

The following is a more detailed explanation of the structure of the column control circuit 15. FIG. 4 is a block diagram of the column control circuit 15. The column control circuit 15 includes a page buffer 30, a latch circuit (SAMP latch) 31, a latch circuit (WD latch) 32, a comparator (Comp) 33, a NAND gate 34, and transfer gates (Enable) 35 to 38, in addition to the column select circuit 23, the write driver 24, and the sense amplifier (SAMP) 25 described above.

The sense amplifier 25 is connected with the latch circuit 31 through the transfer gate 35. Read data read from the memory cell MC by the sense amplifier 25 is transmitted to the transfer gate 35. When a signal RLEN transmitted from the controller 20 is asserted, the transfer gate 35 transfers the read data to the latch circuit 31.

The latch circuit 31 latches data stored in the memory cell MC. Specifically, in a read operation, the latch circuit 31 latches read data with the sense amplifier 25. In a write operation, the latch circuit 31 latches write data (data to be written to the memory cell MC) transferred from the page buffer 30.

The latch circuit 31 is connected with the page buffer 30 through a data line RSIO and the transfer gate 36, and connected with the first input terminal of the comparator 33 through the data line RSIO. The read data latched by the latch circuit 32 is transmitted to the transfer gate 36. When a signal PBIN transmitted from the controller 20 is asserted, the transfer gate 36 transfers the read data to the page buffer 30. The page buffer 30 temporarily stores the read data. The read data latched by the latch circuit 31 is transmitted to the comparator 33.

By contrast, write data is temporarily stored in the page buffer 30. The page buffer 30 is connected with the latch circuit 32 through the transfer gate 37. Write data stored in the page buffer 30 is transmitted to the transfer gate 37. When a signal BANKUP transmitted from the controller 20 is asserted, the transfer gate 37 transfers the write data to the latch circuit 32.

The latch circuit 32 is connected with the write driver 24 and the first input terminal of the comparator 33 through a data line WSIO. Specifically, the write data latched by the latch circuit 32 is transmitted to the write driver 24 and the comparator 33. In addition, the latch circuit 32 is connected with the latch circuit 31 through the transfer gate 38. The Write data latched by the latch circuit 32 is transmitted to the transfer gate 38. When a signal WAYTE<CA> transmitted from the controller 20 is asserted, the transfer gate 38 transfers the write data to the latch circuit 31.

The comparator 33 compares data (write data) of the data line WSIO with data (data stored in the memory cell) of the data line RSIO. When both the data are the same with each other, the comparator 33 asserts (high level) a same signal 'same'. The same signal 'same' is input to the first input terminal of the NAND gate 34. A signal COMPOFFb<CA> is input from the controller 20 to the second input terminal of the NAND gate 34. When the same signal 'same' is negated or when the signal COMPOFFb<CA> is asserted (low level), the NAND gate 34 asserts (high level) an output signal diff. The output signal diff of the NAND gate 34 is transmitted to the write driver 24.

In the present embodiment, before data is written to a memory cell in response to a write command, the comparator 33 compares data (that is, data stored in the latch circuit 31) stored in the memory cell with write data stored in the page buffer 30. When these data are the same with each other, the write data is not written to the memory cell. When these data are different from each other, the write data is written to the memory cell. The signal COMPOFFb<CA> described above is used for negating a comparison result of the comparator 33, and forcibly writing write data to the memory cell. For example, while data is being written to a column in response to a write command, when a second write command for the same column is received (that is, when interruption occurs in the same column), the comparison target compared by the comparator 33 differs. In this case, a signal COMPOFFb<CA> is asserted (low level), to forcibly execute a write operation corresponding to the second write command.

The write driver 24 receives a signal WEN<CA> from the controller 20. When the signal WEN<CA> is asserted and the signal diff is at high level, the write driver 24 writes data of the data line WSIO to the memory cell MC of the corresponding column.

Figure 5:
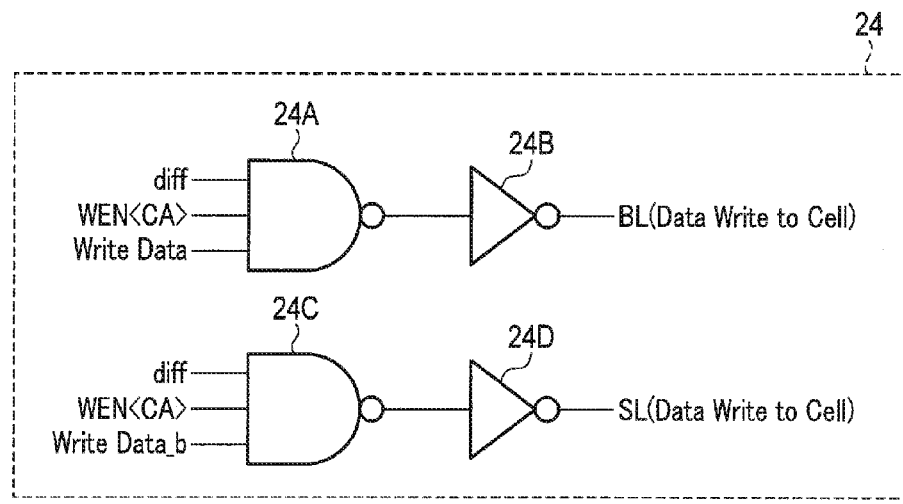
FIG. 5 is a circuit diagram of a write driver illustrated in FIG. 4.

FIG. 5 is a circuit diagram of the write driver 24. FIG. 5 is a circuit diagram of the write driver 24 corresponding to a column. Actually, the write drivers 24 of FIG. 5 are prepared with the number corresponding to the columns. The write driver 24 includes three-input NAND gates 24A and 24C, and inverters (NOT gates) 24B and 24D.

The NAND gate 24A receives a signal diff, a signal WEN<CA>, and write data (data of the data line WSIO). The output of the NAND gate 24A is connected with the input of the inverter 24B. The inverter 24B is connected with a bit line through the column select circuit (not illustrated).

The NAND gate 24C receives a signal diff, a signal WEN<CA>, and inverted data (Write Data_b) of the write data. The output of the NAND gate 24C is connected with the input of the inverter 24D. The inverter 24D is connected with a source line through the column select circuit (not illustrated).

When data "1" is written to the memory cell, the write driver 24 operates to apply a positive voltage to the bit line BL, and apply, for example, a ground voltage to the source line SL. By contrast, when data "0" is written to the memory cell, the write driver 24 operates to apply, for example, a ground voltage to the bit line BL, and apply a positive voltage to the source line SL.

[1-4] Structure of Circuits Included in Controller 20

The controller 20 generates various control signals to control each of the modules of the semiconductor memory device 10. The following is explanation of structures of the circuits included in the controller 20.

Figure 6:
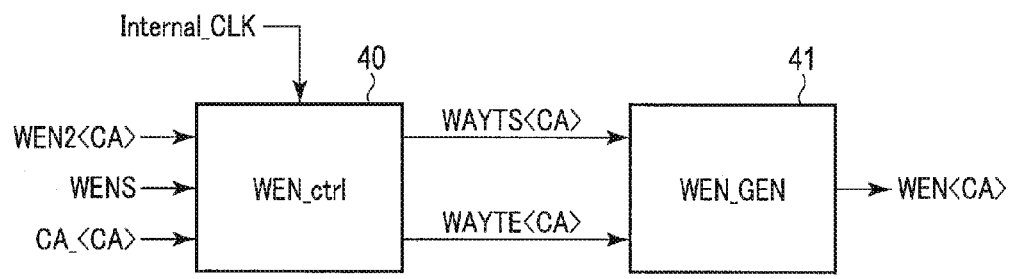
FIG. 6 is a block diagram of a WEN control circuit and a WEN generator.

The controller 20 includes a write enable (WEN) control circuit (WEN_ctrl) 40, and a WEN generator (WEN_GEN) 41. FIG. 6 is a block diagram of the WEN control circuit 40 and the WEN generator 41.

The WEN control circuit 40 receives an internal clock CLK (internal_CLK), a signal WEN2<CA>, a signal WENS, and a column address CA_<CA>. The sign "<CA>" indicates any one column in the columns. Specifically, the signal provided with the sign "<CA>" indicates that any one column is noted. The internal clock CLK is generated using an external clock CLK received from the external device. The semiconductor memory device 10 includes a clock generator (not illustrated), and the clock generator generates an internal clock CLK using an external clock CLK.

The signal WEN2<CA> is generated based on a write command, that is, asserted when a write command is received. The signal WENS is generated based on a signal WEN2<CA>, and is a signal delayed by a predetermined time from the signal WEN2<CA>. "CA_<CA>" is any one column address in a plurality of column addresses.

The WEN control circuit 40 generates a signal WAYTS<CA> and a signal WAYTE<CA>. The signal WAYTS<CA> is a signal to start write to the corresponding column. The signal WAYTS<CA> is a pulse signal that is asserted when the corresponding column is selected and the signal WENS is asserted.

The signal WAYTE<CA> is a signal to end write to the corresponding column. The signal WAYTE<CA> is a pulse signal that is asserted after the signal WAYTS<CA> is asserted and then a predetermined write time elapses. The predetermined write time is set in advance in accordance with the write property of the memory cells. The time from assertion of the signal WAYTS<CA> to assertion of the signal. WAYTE<CA> is counted using a counter.

The WEN generator 41 receives the signal WAYTS<CA> and the signal WAYTE<CA> from the WEN control circuit 40, and generates a signal WEN<CA>. The signal WEN<CA> is asserted from the time when the signal WAYTS<CA> is asserted to the time when the signal WAYTE<CA> is asserted.

[1-5] Structure of WEN Control Circuit 40

<First Circuit 40-1>

FIG. 7 is a block diagram of a first circuit 40-1 (circuit for controlling the selected column) included in the WEN control circuit 40. The WEN control circuit 40 includes a plurality of select circuits 42 corresponding to the respective columns. FIG. 7 illustrates select circuits 42-0 and 42-1 corresponding to two column addresses CA<0> and CA<1>, respectively, in an extracted manner.

The select circuit 42-0 includes a transfer crate (Enable) 43-0 and a latch circuit (Latch) 44-0. The transfer gate 43-0 receives a column address CA<0>. The column address CA<0> is a 1-bit signal indicating whether the column is selected. When the signal WENS is asserted, the transfer gate 43-0 transfers the column address CA<0> to the latch circuit 44-0. The latch circuit 44-0 outputs the latched data as a select signal SEL_CA. The latch circuit 44-0 is reset with a reset signal WARST.

In the same manner, the select circuit 42-1 includes a transfer gate 43-1 and a latch circuit 44-1. Operations of the other select circuits 42 are the same as those of the select circuit 42-0. When the operations of the WEN control circuit 40 are summarized, the WEN control circuit 40 specifies one of the columns, and starts a write operation to the column, at the time when the signal WENS is asserted.

<Second Circuit 40-2>

FIG. 8 is a circuit diagram of a second circuit 40-2 included in the WEN control circuit 40. The second circuit 40-2 includes a pulse generator (SHORT_RST) 50, a signal generator 51, a counter (counter with reset) 52, and a signal generator 53.

The pulse generator 50 receives a signal WEN2<CA>, and generates a reset signal WARST<CA> having a predetermined pulse width (for example, a pulse width shorter than the pulse width of the internal clock), at the timing when the signal WEN2<CA> is asserted.

The signal generator 51 includes a NAND gate 51A, a NOR gate 51B, inverters 51C and 51D, and a set-reset (SR) latch circuit 51E. A signal WENS is input to the first input terminal of the NAND gate 51A, and a column address CA_<CA> is input to the second input terminal thereof. The output of the NAND gate 51A is input to a set terminal S of the SR latch circuit 51E through the inverter 51C.

A reset signal RESET is input to the first input terminal of the NOR gate 51B, and a signal END_CLK_1 is input from the signal generator 53 described later to the second input terminal thereof. The reset signal RESET is a signal to reset a specific operation including a write operation, and is supplied from, for example, the command circuit 19. When a write operation is to be reset, the reset signal RESET is set to high level. The output of the NOR gate 51B is input to a reset terminal R of the SR latch circuit 51E through the inverter 51D.

The SR latch circuit 51E outputs a signal ENABLE_1, in accordance with the states of the set terminal S and the reset terminal R. The SR latch circuit 51E outputs data "1" from an output terminal Q when the set terminal S has data "1", and outputs data "0" from the output terminal Q when the reset terminal R has data "1". An output terminal Q/ thereof outputs inverted data of the output terminal Q.

The counter 52 includes a NAND gate 52A, an inverter 52B, and D-latch circuits 52C and 52D. The first input terminal of the NAND gate 52A receives an internal clock CLK, and the second input terminal thereof receives a signal ENABLE_1 from the SR latch circuit 51E. An output of the NAND gate 52A is input to a clock terminal CLK of the D-latch circuit 52C through the inverter 52B. A white circle illustrated at the clock terminal CLK of the D-latch circuit 52C indicates "active-low".

The D-latch circuit 52C latches data of the input terminal D at a falling edge of the clock, and outputs the latched data as data Q0 from an output terminal Q thereof. An input terminal D of the D-latch circuit 52C receives data Q0*b* of the output terminal Q/ of the D-latch circuit 52C. The data Q0*b* is inverted data of the data Q0. A reset terminal RI of the D-latch circuit 52C receives a reset signal WARST<CA>. When the reset signal WARST<CA> is asserted (for example, in response to a falling edge of the reset signal WARST<CA>), the D-latch circuit 52C is reset.

A clock terminal CLK of the D-latch circuit 52D receives the data Q0 from the D-latch circuit 52C. The D-latch circuit 52D outputs the latched data as data Q1 from the output terminal Q. An input terminal D of the D-latch circuit 52D receives data Q1*b* of the output terminal Q/ of the D-latch circuit 52D. The data Q1*b* is inverted data of the data. Q1. A reset terminal R/ of the D-latch circuit 52D receives a reset signal WARST<CA>. When the reset signal WARST<CA> is asserted (for example, in response to a falling edge of the reset signal WARST<CA>), the D-latch circuit 52D is reset.

The counter 52 structured as described above counts up 2-bit data (data. Q0 is a high-order bit, and data Q1 is a low-order bit) formed of the data Q0 and the data Q1, in response to the clock input to the clock terminal of the D-latch circuit 52C. The counter 52 is a counter with reset capable of resetting the count value with a reset signal WARST<CA>. FIG. 8 illustrates a structure example in which the counter 52 includes two D-latch circuits 52C and 52D, but the number of D-latch circuits may be properly set to acquire a desired count value (wait time "A" described later) with the counter 52.

The signal generator 53 includes NOR gates 53A and 53B, and inverters 53C and 53D. The NOR gate 53A receives data Q1*b* and data Q0 from the counter 52. The NOR gate 53A outputs a signal END_CLK-1_1. The signal END_CLK-1_1 is set to high level when the output of the counter 52 is "10b". The sign "b" attached to the data string indicates binary digits.

The NOR gate 53B receives data Q1*b* and data Q0*b* from the counter 52. The NOR gate 53B outputs a signal END_CLK_1. The signal END_CLK_1 is set to high level when the output of the counter 52 is "11b". The END_CLK_1 is input to the inverter 53C, and the output of the inverter 53C is input to the inverter 53D. The inverter 53D outputs a signal UPDATE_WSIO<CA>.

<Third Circuit 40-3>

FIG. 9 is a circuit diagram of a third circuit 40-3 included in the WEN control circuit 40. The third circuit 40-3 includes a signal generator 54, a counter (counter without reset) 55, and a signal generator 56.

The signal generator 54 includes a NOR gate 54*a*, an inverter 54B, and an SR latch circuit 54C. The first input terminal of the NOR gate 54A receives a reset signal RESET, and a second input terminal thereof receives a signal END_CLK_2 from the signal generator 56 described later. The output of the NOR gate 54A is input to a reset terminal R of the SR latch circuit 54C through the inverter 54B.

A set terminal S of the SR latch circuit 54C receives a signal END_CLK-1_1 from the signal generator 53 illustrated in FIG. 8. The SR latch circuit 54C outputs a signal ENABLE_2 in response to the states of the set terminal S and the reset terminal R.

The counter 55 includes a NAND gate 55A, an inverter 55B, and D-latch circuits 55C and 55D. The first input terminal of the NAND gate 55A receives an internal clock CLK, and the second input terminal thereof receives a signal ENABLE_2 from the SR latch circuit 54C. The output of the NAND gate 55A is input to a clock terminal CLK of the D-latch circuit 55C through the inverter 55B.

The D-latch circuit 55C latches data of the input terminal D at a falling edge of the clock, and outputs the latched data as data Q2 from an output terminal Q thereof. An input terminal D of the D-latch circuit 55C receives data Q2*b* of an output terminal Q/ of the D-latch circuit 55C. The data Q2*b* is inverted data of the data Q2. A ground voltage VSS is applied to a reset terminal R/ of the D-latch circuit 55C. Specifically, the D-latch circuit 55C is configured not to be reset with the reset terminal R/.

A clock terminal CLK of the D-latch circuit 55D receives data Q2 from the D-latch circuit 55C. The D-latch circuit 55D outputs the latched data as data Q3 from an output terminal Q thereof. An input terminal D of the D-latch circuit 55D receives data Q3*b* of an output terminal Q/ of the D-latch circuit 55D. The data Q3*b* is inverted data of the data Q3. A ground voltage VSS is applied to a reset terminal R/ of the D-latch circuit 55D. Specifically, the D-latch circuit 55D is configured not to be reset with the reset terminal R/.

The counter 55 structured as described above counts up 2-bit data (data Q2 is a high-order bit, and data Q3 is a low-order bit) formed of the data Q2 and the data Q3, in response to the clock input to the clock terminal of the D-latch circuit 55C. The counter 55 is a counter without reset in which a count value is not reset with a reset signal WARST<CA>, unlike the counter 52 described above. FIG. 9 illustrates a structure example in which the counter 55 includes two D-latch circuits 55C and 55D, but the number of D-latch circuits may be properly set to acquire a desired count value (wait time "B" described later) with the counter 55.

The signal generator 56 includes NOR gates 56A to 56C, and inverters 56D to 56G. The NOR gate 56A receives data Q3 and data Q2*b* from the counter 55. The NOR gate 56A outputs a signal P_START_2. The signal P_START_2 is set to high level when the output of the counter 55 is "01xxb". In the data string, the third bit corresponds to the data Q2, and the fourth bit corresponds to the data Q3. The two low-order bits "xx" in the data string indicates the output (data Q0 and data Q1) of the counter 52 described above. The signal P_START_2 is input to the inverter 56D, and the output of the inverter 56D is input to the inverter 56E. The inverter 56E outputs a signal WAYTS<CA>.

The NOR gate 56B receives data Q3*b* and data Q2 from the counter 55. The NOR gate 56B outputs a signal END_CLK-1_2. The signal END_CLK-1_2 is set to high level when the output of the counter 55 is "10xxb". The signal END_CLK-1_2 is input to the inverter 56F, and the output of the inverter 56F is input to the inverter 56G. The inverter 56G outputs a signal WAYTE<CA>.

The NOR gate 56C receives data Q3b and data Q2b from the counter 55. The NOR gate 56C outputs a signal END_CLK_2. The signal END_CLK_2 is set to high level when the output of the counter 55 is "11xxb".

Suppose that the time of one cycle of the internal clock CLK is "tCK". Suppose that "n" indicates a difference between the first count value corresponding to the signal END_CLK-1_3 and the second count value corresponding to the signal P_START_2. The write time while the WEN<CA> is asserted is "n×tCK".

[2] Operations

The following is explanation of operations of the semiconductor memory device 10 structured as described above.

[2-1] Example of Interruption in Write Operation

Figure 10:
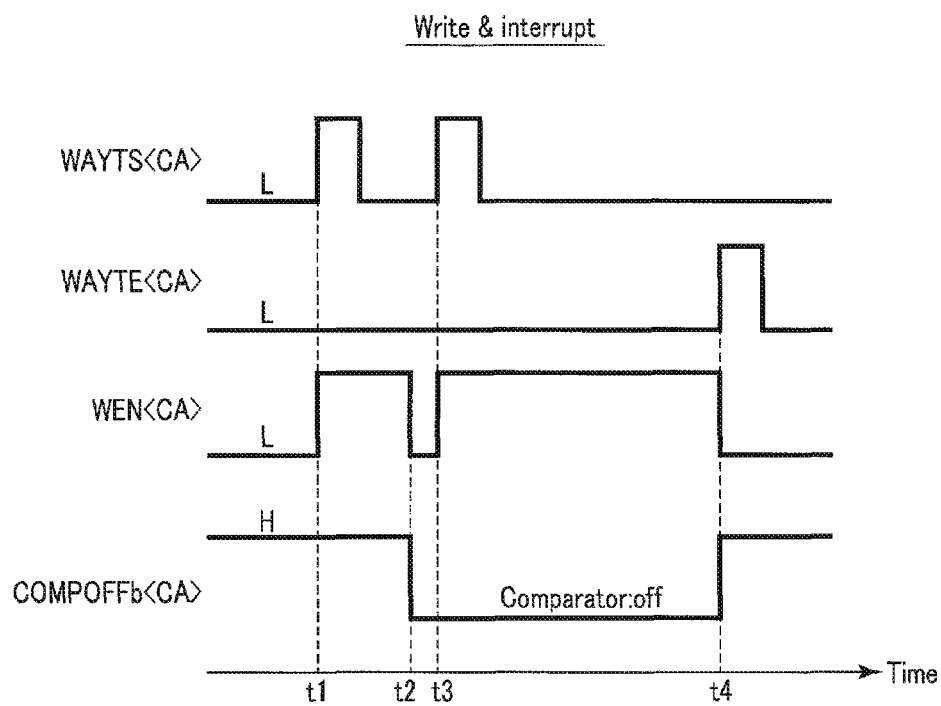
FIG. 10 is a flowchart illustrating an example of interruption in a write operation.

FIG. 10 is a flowchart illustrating an example of interruption in a write operation.

The controller 20 receives a write command, an address, and write data from an external device, and thereafter starts a write operation. At time t1, the controller 20 asserts (high level) a start signal WAYTS<CA>, based on a signal WEN2<CA>, a signal WENS, and a column address CA_<CA>, and asserts a write enable signal WEN<CA> in response to the signal WAYTS<CA>.

At time t2, suppose that the controller 20 receives a write command for the same column from the external device. The controller 20 asserts (low level) a signal COMPOFFb<CA>, and negates a signal WEN<CA>.

At time t3, the controller 20 asserts the signal WAYTS<CA> in response to the second write command for the same column, and asserts the signal WEN<CA> in response to the signal WAYTS<CA>. Thereafter, a write operation to the corresponding memory cell is performed. The controller 20 counts the predetermined write time.

At time t4, the controller 20 asserts an end signal WAYTE<CA>, and negates the signal WEN<CA> in response to the signal WAYTE<CA>. The controller 20 also negates the signal COMPOFFb<CA>.

Originally, in the interruption operation illustrated in FIG. 10, because the signal COMPOFFb<CA> is asserted, the comparison result of the comparator 33 illustrated in FIG. 4 is negated, and the write driver 24 forcibly writes write data to the memory cell. This is undesirable from the viewpoint of deterioration of the memory cell and power consumption. In the write sequence according to the following embodiment, even when interruption relating to a write command occurs, the signal COMPOFFb<CA> is not asserted, that is, an interruption state does not occur inside the semiconductor memory device 10.

[2-2] Write Sequence

The following is explanation of a series of operations (write sequence) in a write operation according to the present embodiment.

First Example

Figure 11:
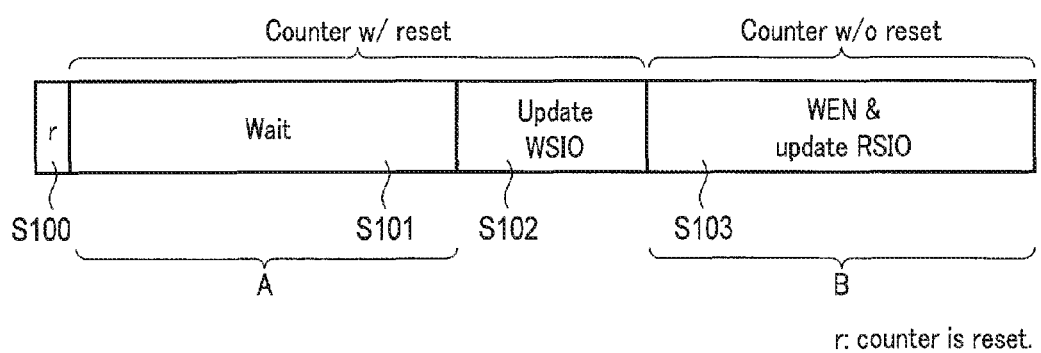
FIG. 11 is a flowchart illustrating a write sequence according to a first example.

FIG. 11 is a flowchart illustrating a write sequence according to a first example.

When a write command is received from the exterior and the signal WEN2<CA> is asserted, the counter 52 illustrated in FIG. 8 is reset with a reset signal WARST<CA> (Step S100).

Thereafter, the controller 20 enters a wait state (Step S101). Specifically, the counter 52 starts a count operation after the reset signal WARST<CA> is asserted. Thereafter, when the count value of the counter 52 reaches the predetermined time "A", the signal generator 53 asserts the signal UPDATE_WSIO<CA>.

When the signal UPDATE_WSIO<CA> is asserted, the controller 20 updates the write data of the data line WSIO (Step S102). Thereafter, the controller 20 asserts the signal WEN<CA>. During a period in which the signal WEN<CA> is asserted, a write operation to the memory cell is performed.

Thereafter, when the write operation to the memory cell is finished, the controller 20 negates the signal WEN<CA>. Thereafter, the controller 20 updates the data of the data line RSIO using the write data (Step S103).

Step S101 and Step S102 are controlled by the counter 52 with reset illustrated in FIG. 8, and Step S103 is controlled by the counter 55 without reset illustrated in FIG. 9. Supposing that the wait time of Step S101 is "A" and the processing time of Step S103 is "B", the wait time "A" is set equal to or longer than the processing time "B". The relation between them can be set with the counter 52 and the counter 55. Specifically, the number of D-latch circuits is properly set.

Second Example

FIG. 12 is a flowchart illustrating a write sequence according to a second example. The second example is an example in which interruption occurs at any timing during Step S100 to Step S102. The interruption herein is based on the assumption that the second write command for the same column occurs during processing of the first write command.

When interruption occurs during the wait state (Step S101) or update of the data line WSIO (Step S102), the signal WEN2<CA> is asserted and the reset signal WARST<CA> is asserted in response to it, as illustrated in FIG. 8. When the reset signal WARST<CA> is asserted, the counter 52 is reset (Step S200). Thereafter, the wait state (Step S201), update of the data line WSIO (Step S202), and a write operation and update of the data line RSIO (Step S203) are successively performed.

In the write sequence illustrated in the second example, after update of the data line WSIO is finished for the first write command, update of the data line WSIO is performed for the second write command. Specifically, the data state inside the semiconductor memory device 10 is enabled to follow write data relating to a plurality of write commands.

Third Example

Figure 13:
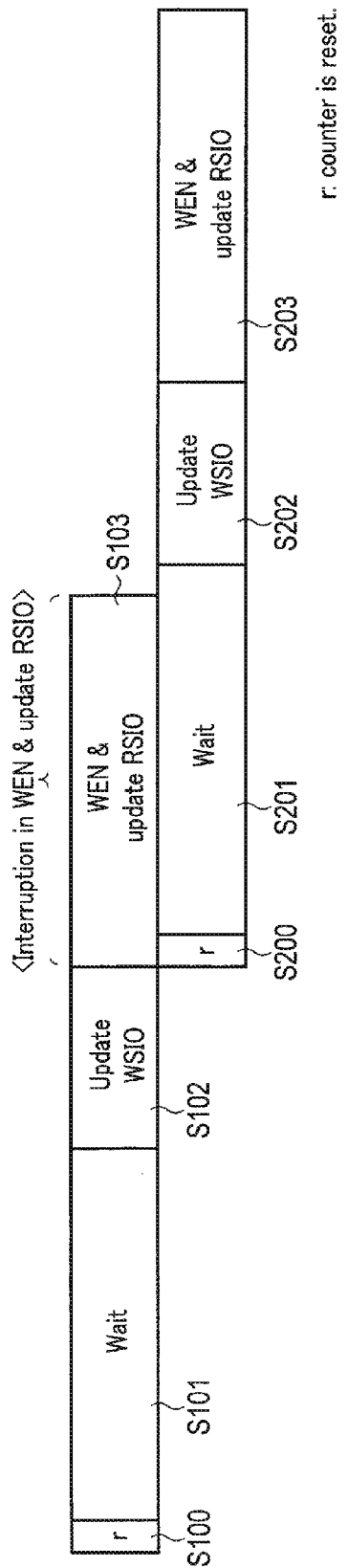
FIG. 13 is a flowchart illustrating a write sequence according to a third example.

FIG. 13 is a flowchart illustrating a write sequence according to a third example. The third example is an example in which interruption occurs at any timing during the period of Step S103.

When interruption occurs at any timing during the period of the write operation to the memory cell and update of the data line RSIO (Step S103), the controller 20 performs reset of the counter 52 (Step S200), and the wait state (Step S201). As described above, the wait time "A" of Step S201 is set equal to or longer than the processing time "B" of Step S103. Specifically, during the wait time of Step S201, the write operation for the first write command and update of the data line RSIO (Step S103) are finished.

Thereafter, the controller 20 successively performs update of the data line WSIO for the second write command (Step S202), and the write operation and update of the data line RSIO (Step S203).

In the third example, a series of operations for the second write command are performed, after the write operation and update of the data line RSIO for the first write command are finished. For this reason, no interruption occurs inside the semiconductor memory device 10. Accordingly, the controller 20 is not required to assert (low level) the signal COMPOFFb<CA>, and an ordinary write operation using the comparator 33 is performed. Specifically, also in the third example, the data state inside the semiconductor memory device 10 is enabled to follow write data relating to a plurality of write commands.

[2-3] Details of Write Sequence

Figure 14:
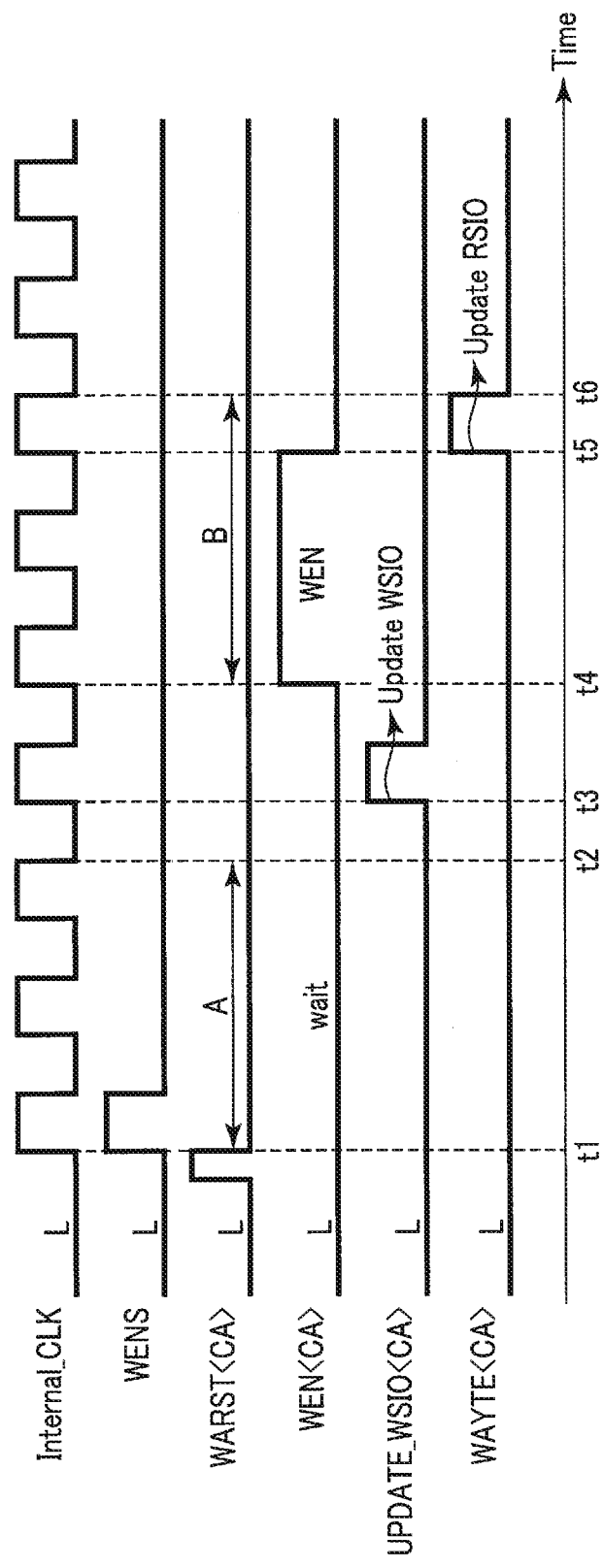
FIG. 14 is a timing chart of the write sequence.

The following is explanation of details of the write sequence. FIG. 14 is a timing chart of the write sequence.

As illustrated in FIG. 8, when the signal WEN2<CA> is asserted, the pulse generator 50 asserts (high level) the reset signal WARST<CA> in response to it. The counter 52 is reset at a falling edge of the reset signal WARST<CA>.

At time t1, the controller 20 asserts the signal WENS based on the signal WEN2<CA>. When the signal WENS is asserted, the counter 52 starts a count operation. The wait state is started at the time t1. The wait state continues to the time t2.

When the wait state is finished, that is, when the wait time "A" lapses, at the time t3, the signal generator 53 asserts the signal UPDATE_WSIO<CA>. When the signal UPDATE_WSIO<CA> is asserted, the controller 20 asserts a signal BANKUP illustrated in FIG. 4. In response to the signal BANKUP, the transfer gate 37 transfers the write data stored in the page buffer 37 to the latch circuit 32. In this manner, the latch circuit 32 latches the write data, and data of the data line WSIO is updated. The signal BANKUP is a signal necessary for controlling a memory bank in a further divided manner. The method for generating a signal BANKUP will be described later. When a memory bank is not controlled in a further divided manner, a signal UPDATE_WSIO<CA> may be used instead of a signal BANKUP.

As illustrated in FIG. 9, when the signal END_CLK-1_1 is asserted by the signal generator 53, the counter 55 starts a count operation. Specifically, the counter 55 counts up from a rising edge of the internal clock CLK after the signal UPDATE_WSIO<CA> is asserted by the signal generator 53. In this manner, the processing time "B" starts from the time t4. At time t4, the signal WEN<CA> is asserted, and the write operation to the memory cell is performed.

At time t5, in accordance with the count value of the counter 55, the signal WAYTE<CA> is asserted, and the signal WEN<CA> is negated. When the signal WAYTE<CA> is asserted, the transfer gate 38 transfers the write data latched by the latch circuit 32 to the latch circuit 31. In this manner, the latch circuit 31 latches the data written to the memory cell in response to this write command, and data of the data line RSIO is updated.

At time t6, the processing time "B" lapses, and the write operation and update of the data line RSIO are finished.

[3] Embodiment of Column Control Circuit 15

The following is explanation of a more specific embodiment of the column control circuit 15. FIG. 15 is a block diagram of the column control circuit 15 according to the embodiment. Some of the reference symbols provided in FIG. 15 correspond to the symbols provided in FIG. 4.

The column control circuit 15 includes an ECC circuit (ECC encoder 60 and ECC decoder 61). The ECC encoder 60 generates an error correcting code for write data, and the error correcting code is added to the write data. The ECC decoder 61 corrects an error of read data using the error correcting code included in the read data. The error correcting code is deleted from the read data.

FIG. 15 illustrates an embodiment in which a bank 11 is formed of two sub-banks 11A and 11B. In FIG. 15, the two sub-banks 11A and 11B are denoted by Bank (up) and Bank (down), respectively.

As illustrated in FIG. 15, the data line RSIO is connected with the ECC decoder 61. The ECC decoder 61 is connected with the first input terminal of a multiplexer (select circuit) 62. The second input terminal of the multiplexer 62 is connected with an input/output line IO (also referred to as data line DQ). A control terminal of the multiplexer 62 receives a signal WRITE transmitted from the controller 20. The multiplexer 62 selects the first input terminal (ECC decoder 61) when the signal WRITE is negated (read operation), and selects the second input terminal (input/output line IO) when the signal WRITE is asserted (write operation).

The output of the multiplexer 62 is connected with the page buffer 30 through the transfer gate 36. The transfer gate 36 is turned on when a signal PBIN transmitted from the controller 20 is at high level and an inverted signal PBINb of the signal PBIN is at low level.

Two inverters 63 and 64 are connected in series with the output of the page buffer 30. The output of the inverter 64 is connected with latch circuits 32-1 and 32-4 through transfer gates 37-1 and 37-4, respectively. The output of the inverter 64 is also connected with the input of the ECC encoder 60. The output of the ECC encoder 60 is connected with latch circuits 32-2 and 32-3 through transfer gates 37-2 and 37-3, respectively.

The output of the latch circuit 32-1 is connected with the data line WSIO. The data line WSIO is connected with a write driver unit 65-1, and connected with the input of a latch circuit 31-1 through a transfer gate 38-1. The output of the latch circuit 31-1 is connected with the data line RSIO.

The output of the latch circuit 32-2 is connected with a data line WSIOP. The data line WSIOP is connected with a write driver unit 65-2, and connected with the input of a latch circuit 31-2 through a transfer gate 38-2. The output of the latch circuit 31-2 is connected with a data line RSIOP. The data line WSIOP and the data line RSIOP are data lines for error correcting codes.

In the same manner as the sub-bank 11A, the sub-bank 11B includes write driver units 65-3 and 65-4, transfer gates 38-3 and 38-4, and latch circuits 31-3 and 31-4.

Figure 16:
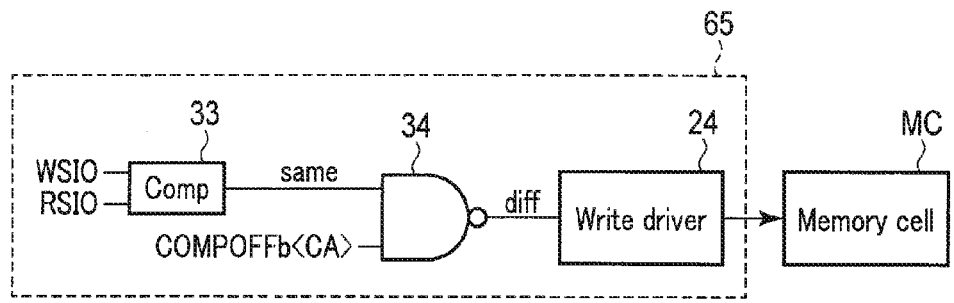
FIG. 16 is a block diagram of a write driver unit illustrated in FIG. 15.

FIG. 16 is a block diagram of each write driver unit 65. Each write driver unit 65 includes a comparator (Comp) 33, a NAND gate 34, and a write driver 24. Operations of the comparator 33, the NAND gate 34, and the write driver 24 are the same as the operations explained using FIG. 4.

[3-1] Structure of Signal Generator 66

Figure 17:
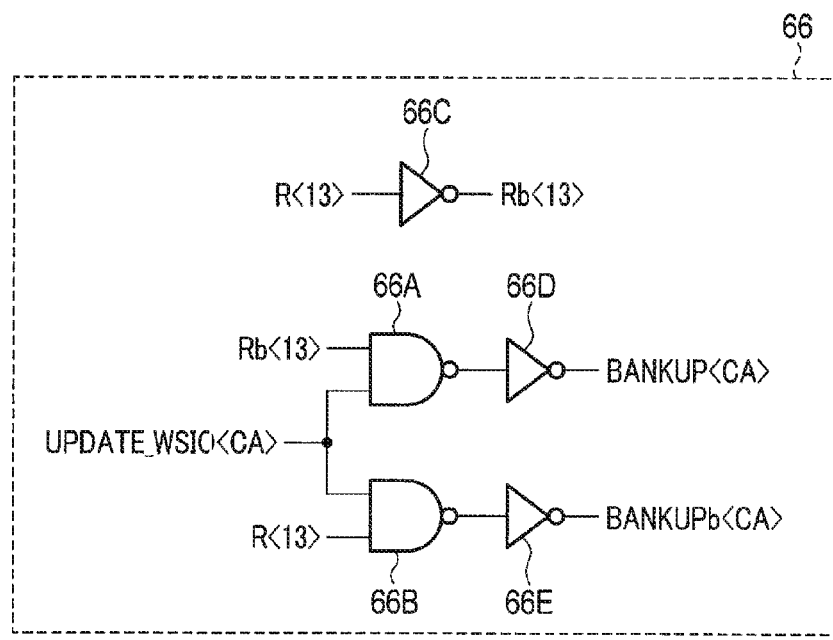
FIG. 17 is a circuit diagram of a signal generator included in a controller.

FIG. 17 is a circuit diagram of a signal generator 66. The signal generator 66 is included in the controller 20. The signal generator 66 includes NAND gates 66A and 66B, and inverters 66C to 66E.

The signal generator 66 receives a row address R<13>. For example, the whole row address is formed of 14 bits of R<0> to R<13>. The row address R<13> corresponds to one bit of the whole row address. The row address R<13> is an address to select either of two sub-banks included in a bank.

The inverter 66C receives the row address R<13>, and outputs a signal Rb<13> obtained by inverting the row address R<13>.

The first input terminal of the NAND gate 66A receives the signal Rb<13>, and the second input terminal thereof receives the signal UPDATE_WSIO<CA> illustrated in FIG. 8. The output of the NAND gate 66A is connected with the input of the inverter 66D, and the inverter 66D outputs a signal BANKUP<CA>. The signal BANKUP<CA> is set to high level when the signal Rb<13> is at high level and the signal UPDATE_WSIO<CA> is at high level.

The first input terminal of the NAND gate 66B receives the row address R<13>, and a second input terminal thereof receives the signal UPDATE_WSIO<CA>. The output of the NAND gate 66B is connected with the input of the inverter 66E, and the inverter 66E outputs a signal BANKUPb<CA>. The signal BANKUPb<CA> is an inverted signal of the signal BANKUP<CA>. The signal BANKUPb<CA> is set to high level when the row address R<13> is at high level and the signal UPDATE_WSIO<CA> is at high level.

[3-2] Operations of Column Control Circuit 15

The following is explanation of operations of the column control circuit 15 illustrated in FIG. 15.

In a write operation, the signal PBIN is set to high level, and write data is transferred from the input/output line IO to the page buffer 30. When the row address designates the sub-bank 11A, the signal BANKUP is set to high level, and the transfer gates 37-1 and 37-2 are turned on.

The data of the page buffer 30 is latched by the latch circuit 32-1 through the transfer gate 37-1. The data of the page buffer 30 is also transmitted to the ECC encoder 60, and the ECC encoder 60 generates an error correcting code (parity code). The error correcting code generated by the ECC encoder 60 is latched by the latch circuit 32-2 through the transfer gate 37-2.

The data items of the latch circuits 32-1 and 32-2 are transmitted to the write driver units 65-1 and 65-2, respectively, and written to the memory cell by the write driver units 65-1 and 65-2.

When a write by the write driver units 65-1 and 65-2 is finished, the signal WAYTE<CA> is changed to high level. Accordingly, the data items of the data lines WSIO and WSIOP are latched by the latch circuits 31-1 and 31-2, respectively. In this manner, the data items of the data lines RSIO and RSIOP are updated.

When write to the sub-bank 11B is performed, the signal BANKUPb is set to high level, and the transfer gates 37-3 and 37-4 are turned on. In this manner, operations similar to those on the sub-bank 11A are performed on the sub-bank 11B.

[4] Effects of Embodiment

Before data is written to the memory cell in response to a write command, data stored in the memory cell is stored in the latch circuit, and compared with the write data stored in the page buffer. When the data are different from each other, the write data is written to the memory cell. This structure reduces the number of write operations causing write current to flow through the memory cell, reduces the power consumption, and suppresses deterioration in properties of the memory cell.

When interruption occurs in write to the same column address, specifically, when a second write command is received while a first write command is being processed in the same column address, the data of the latch circuit does not match the write data of the page buffer (the data is not followed), which are used for data comparison. When such interruption occurs, it is necessary to assert the signal COMPOFFb to negate data comparison and forcibly perform a write operation. However, this is not preferable in terms of durability of the memory cells and power consumption relating to a write current.

In the present embodiment, the semiconductor memory device 10 includes memory cells MC, the page buffer 30 receiving write data from exterior, the first latch circuit 31 latching data stored in the memory cell MC, the second latch circuit 32 latching data transferred from the page buffer 30, the controller 20, and the write circuit (write driver) 24. When a write command is received, the controller 20 enters a wait state for the first period "A" and performs a first transfer operation to transfer data from the page buffer 30 to the second latch circuit 32 after the wait state. The write circuit 24 performs a write operation to write the data of the second latch circuit 32 to the memory cell MC, when the data of the first latch circuit 31 is different from the data of the second latch circuit 32. The controller 20 performs a second transfer operation to transfer data from the second latch circuit 32 to the first latch circuit, after the write operation. The first period "A" is set equal to or longer than the second period "B" ranging from start of the write operation to finish of the second transfer operation.

According to the present embodiment, when a write command is received, the controller temporarily enters a wait state, and the first transfer operation (update of the data line WSIO), the write operation, and the second transfer operation (update of the data line RSIO) are successively performed after the wait state. With the structure, no interruption relating to write occurs inside the semiconductor memory device 10. Specifically, when the second write command is received after the first write command is received, update of the data line WSIO for the second write command is started after update of the data line RSIO for the first write command is finished.

This structure enables the data state inside the semiconductor memory device 10 to follow write data relating to a plurality of write commands. This structure prevents nullification of data comparison using the signal COMPOFFb, and achieves a write operation always using data comparison. This structure reduces the number of write operations to the memory cell, reduces the power consumption, and suppresses deterioration in property of the memory cell.

The MRAM illustrated in the above embodiments may be a spin-transfer torque magnetoresistive random access memory (STT-MRAM) using a spin-transfer torque phenomenon for magnetization switching of the magnetic layer.

The above embodiments illustrate a MRAM using magnetoresistive effect elements serving as variable resistive elements, as the semiconductor memory device, but the structure is not limited thereto. The embodiments may be applied to various types of semiconductor memory devices including elements enabling storage (retention) or read of data using change in resistance, by supply of a current or application of a voltage. The embodiments are also applicable to a resistance change memory like a MRAM, such as a resistive random access memory (ReRAM) and a phase-change random access memory (PCRAM).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory device comprising:
   a memory cell;
   a data buffer which receives write data from an exterior;
   a first latch circuit which latches data stored in the memory cell;
   a second latch circuit which latches data transferred from the data buffer;
   a controller which performs a first transfer operation to transfer data from the data buffer to the second latch circuit after a write command is received and then a first period elapses; and
   a write circuit which performs a write operation to write data of the second latch circuit to the memory cell after the first transfer operation, when data of the first latch circuit is different from the data of the second latch circuit,
   wherein the controller performs a second transfer operation to transfer data from the second latch circuit to the first latch circuit after the write operation,
   wherein the first period is equal to or longer than a second period ranging from a start of the write operation to a finish of the second transfer operation, and
   wherein the write circuit does not write the data of the second latch circuit to the memory cell, when the data of the first latch circuit is equal to the data of the second latch circuit.

2. The device of claim 1, further comprising a generator which generates an enable signal asserted during the write operation,
   wherein the controller performs the second transfer operation after the enable signal is negated.

3. The device of claim 1, further comprising a comparator which compares the data of the first latch circuit with the data of the second latch circuit,
   wherein the write circuit operates in accordance with a comparison result of the comparator.

4. The device of claim 3, further comprising:
   a first data line connecting the first latch circuit with a first input terminal of the comparator; and
   a second data line connecting the second latch circuit with a second input terminal of the comparator.

5. The device of claim 1, further comprising:
   a sense amplifier which reads data of the memory cell; and
   a third transfer gate which transfers the read data to the first latch circuit.

6. The device of claim 1, wherein, when a second write command is received during the write operation for a first write command, the controller performs the first transfer operation for the second write command after the second transfer operation for the first write command.

7. The device of claim 1, wherein, when a second write command is received during the second transfer operation for a first write command, the controller performs the first transfer operation for the second write command after the second transfer operation for the first write command.

8. The device of claim 1, wherein, when a second write command is received during the first transfer operation for a first write command, the controller performs the first transfer operation for the second write command after the first transfer operation for the first write command.

9. The device of claim 1, wherein the memory cell includes a variable resistive element.

10. The device of claim 1, wherein the memory cell includes a magnetoresistive element.

11. The device of claim 1, wherein the memory device is a spin-transfer torque magnetoresistive random access memory (STT-MRAM).

12. A memory device comprising:
    a memory cell;
    a data buffer which receives write data from an exterior;
    a first latch circuit which latches data stored in the memory cell;
    a second latch circuit which latches data transferred from the data buffer;
    a controller which performs a first transfer operation to transfer data from the data buffer to the second latch circuit after a write command is received and then a first period elapses; and
    a write circuit which performs a write operation to write data of the second latch circuit to the memory cell after the first transfer operation, when data of the first latch circuit is different from the data of the second latch circuit,
    wherein the controller performs a second transfer operation to transfer data from the second latch circuit to the first latch circuit after the write operation,
    wherein the first period is equal to or longer than a second period ranging from a start of the write operation to a finish of the second transfer operation,
    wherein the memory device further comprises:
      a first counter which counts the first period; and
      a second counter which counts the second period, and
    wherein the first counter is reset in response to the write command.

13. The device of claim 12, wherein the second counter starts a count operation in response to a first signal from the first counter, after the first period lapses.

14. The device of claim 12, wherein:
    the first counter generates a second signal after the first period is counted, and
    the controller performs the first transfer operation in response to the second signal.

15. A memory device comprising:
    a memory cell;
    a data buffer which receives write data from an exterior;
    a first latch circuit which latches data stored in the memory cell;
    a second latch circuit which latches data transferred from the data buffer;
    a controller which performs a first transfer operation to transfer data from the data buffer to the second latch circuit after a write command is received and then a first period elapses; and
    a write circuit which performs a write operation to write data of the second latch circuit to the memory cell after the first transfer operation, when data of the first latch circuit is different from the data of the second latch circuit,
    wherein the controller performs a second transfer operation to transfer data from the second latch circuit to the first latch circuit after the write operation,
    wherein the first period is equal to or longer than a second period ranging from a start of the write operation to a finish of the second transfer operation, and
    wherein the memory device further comprises:
      a first transfer gate connected between the data buffer and the second latch circuit; and
      a second transfer gate connected between the second latch circuit and the first latch circuit.

* * * * *